United States Patent
Fujiwara

(10) Patent No.: US 11,652,466 B2
(45) Date of Patent: May 16, 2023

(54) SUPPRESSION OF TRANSVERSE MODE SPURIOUS SIGNALS IN SURFACE ACOUSTIC WAVE DEVICES UTILIZING A DENSE FILM ABOVE GAP REGION OF INTERDIGITAL TRANSDUCER ELECTRODES

(71) Applicant: SKYWORKS SOLUTIONS, INC., Irvine, CA (US)

(72) Inventor: Joji Fujiwara, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 217 days.

(21) Appl. No.: 16/999,183

(22) Filed: Aug. 21, 2020

(65) Prior Publication Data

US 2021/0067134 A1  Mar. 4, 2021

Related U.S. Application Data

(60) Provisional application No. 62/893,408, filed on Aug. 29, 2019.

(51) Int. Cl.
*H03H 9/145* (2006.01)
*H03H 9/64* (2006.01)
*H03H 9/25* (2006.01)
*H03H 9/05* (2006.01)

(52) U.S. Cl.
CPC ............ *H03H 9/145* (2013.01); *H03H 9/058* (2013.01); *H03H 9/25* (2013.01); *H03H 9/6483* (2013.01)

(58) Field of Classification Search
CPC ............ H03H 9/02; H03H 9/145; H03H 9/25; H03H 9/64
See application file for complete search history.

(56) References Cited

U.S. PATENT DOCUMENTS

| | | | | |
|---|---|---|---|---|
| 7,939,989 B2 * | 5/2011 | Solal | ..................... | H03H 9/1452 310/313 C |
| 8,896,399 B2 * | 11/2014 | Miura | ................. | H03H 9/02858 333/194 |
| 9,035,725 B2 * | 5/2015 | Komatsu | ............ | H03H 9/02858 333/193 |
| 9,473,108 B2 * | 10/2016 | Nakamura | ................ | H03H 3/08 |
| 9,640,750 B2 * | 5/2017 | Nakanishi | .......... | H03H 9/02984 |
| 9,673,779 B2 * | 6/2017 | Ruile | ................. | H03H 9/02858 |
| 9,748,924 B2 * | 8/2017 | Komatsu | ............ | H03H 9/02818 |
| 10,469,050 B2 * | 11/2019 | Gamble | ............. | H03H 9/02015 |
| 10,938,371 B2 * | 3/2021 | Nakamura | ......... | H03H 9/02834 |
| 2018/0054179 A1 * | 2/2018 | Gamble | ............. | H03H 9/02015 |
| 2020/0162052 A1 * | 5/2020 | Matsuoka | .......... | H03H 9/02535 |

* cited by examiner

*Primary Examiner* — Hafizur Rahman
*Assistant Examiner* — Alan Wong
(74) *Attorney, Agent, or Firm* — Lando & Anastasi, LLP

(57) ABSTRACT

An acoustic wave device comprises a substrate including a piezoelectric material, interdigital transducer (IDT) electrodes disposed on a surface of the substrate, the IDT electrodes having gap regions, edge regions, and center regions, a first dielectric film having a lower surface disposed on the IDT electrodes and the surface of the substrate, and a material having a density greater than a density of the first dielectric film disposed above the gap regions of the IDT electrodes.

10 Claims, 18 Drawing Sheets

SUPPRESSION OF TRANSVERSE MODE SPURIOUS SIGNALS IN SURFACE ACOUSTIC WAVE DEVICES UTILIZING A DENSE FILM ABOVE GAP REGION OF INTERDIGITAL TRANSDUCER ELECTRODES

CROSS-REFERENCE TO RELATED APPLICATIONS

This application claims priority under 35 U.S.C. § 119(e) to U.S. Provisional Patent Application No. 62/893,408, titled SUPPRESSION OF TRANSVERSE MODE SPURIOUS SIGNALS IN SURFACE ACOUSTIC WAVE DEVICES UTILIZING A DENSE FILM ABOVE GAP REGION OF INTERDIGITAL TRANSDUCER ELECTRODES, filed Aug. 29, 2019, the content of which being incorporated herein in its entirety for all purposes.

BACKGROUND

Technical Field

Embodiments of this disclosure relate to acoustic wave devices and to suppression of transverse mode spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with an aspect, there is provided an acoustic wave device. The acoustic wave device comprises a substrate including a piezoelectric material, interdigital transducer (IDT) electrodes disposed on a surface of the substrate, the IDT electrodes having gap regions, edge regions, and center regions, a first dielectric film having a lower surface disposed on the IDT electrodes and the surface of the substrate, and a material having a density greater than a density of the first dielectric film disposed above the gap regions of the IDT electrodes.

In some embodiments, a velocity of an acoustic wave in the gap regions is greater than the velocity of the acoustic wave in the center regions, and the velocity of the acoustic wave in the center regions is greater than the velocity of the acoustic wave in the edge regions.

In some embodiments, the material is a metal. The material may be a same metal as a metal included in the IDT electrodes. The material may be a different metal from a metal or metals included in the IDT electrodes.

In some embodiments, the material is a dielectric material.

In some embodiments, the material is disposed within the first dielectric film.

In some embodiments, the material is disposed on an upper surface of the first dielectric film.

In some embodiments, widths of the IDT electrodes in the edge regions are greater than widths of the IDT electrodes in the center regions, the width direction being parallel to a propagation direction of a main acoustic wave through the acoustic wave device.

In some embodiments, the acoustic wave device further comprises a second dielectric film having an acoustic velocity greater than an acoustic velocity of the first dielectric film disposed on an upper surface of the first dielectric film.

In some embodiments, the second dielectric film has a thickness above the center region that is greater than a thickness of the second dielectric film above the edge regions and in the gap regions.

In some embodiments, the material is further disposed above the edge regions.

In some embodiments, the material is a contiguous strip extending above both the gap and edge regions. The contiguous strip may be disposed within the first dielectric film. The contiguous strip may be disposed on an upper surface of the first dielectric film.

In some embodiments, the material includes first segments disposed above the edge regions at a first height above the IDT electrodes and second segments disposed above the gap regions at a second height above the IDT electrodes.

In some embodiments, one of the first segments or the second segments are disposed on an upper surface of the first dielectric film.

In some embodiments, the first segments have different thicknesses than the second segments.

In some embodiments, the material is not disposed over the center regions of the IDT electrodes.

In some embodiments, the IDT electrodes include a layer of tungsten.

In accordance with another aspect, there is provided a radio frequency filter. The radio frequency filter comprises at least one acoustic wave device, the at least one acoustic wave device including a substrate including a piezoelectric material, interdigital transducer (IDT) electrodes disposed on a surface of the substrate, the IDT electrodes having gap regions, edge regions, and center regions, a first dielectric film having a lower surface disposed on the IDT electrodes and the surface of the substrate, and a material having a density greater than a density of the first dielectric film disposed above the gap regions of the IDT electrodes.

In accordance with another aspect, there is provided an electronics module. The electronics module comprises at least one radio frequency filter including at least one acoustic wave device, the at least one acoustic wave device including a substrate including a piezoelectric material, interdigital transducer (IDT) electrodes disposed on a surface of the substrate, the IDT electrodes having gap regions, edge regions, and center regions, a first dielectric film having a lower surface disposed on the IDT electrodes and the surface of the substrate, and a material having a density greater than a density of the first dielectric film disposed above the gap regions of the IDT electrodes.

In some embodiments, the IDT electrodes include one of W, Pt, Au, Cu, Zn, Ag, or Mo.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
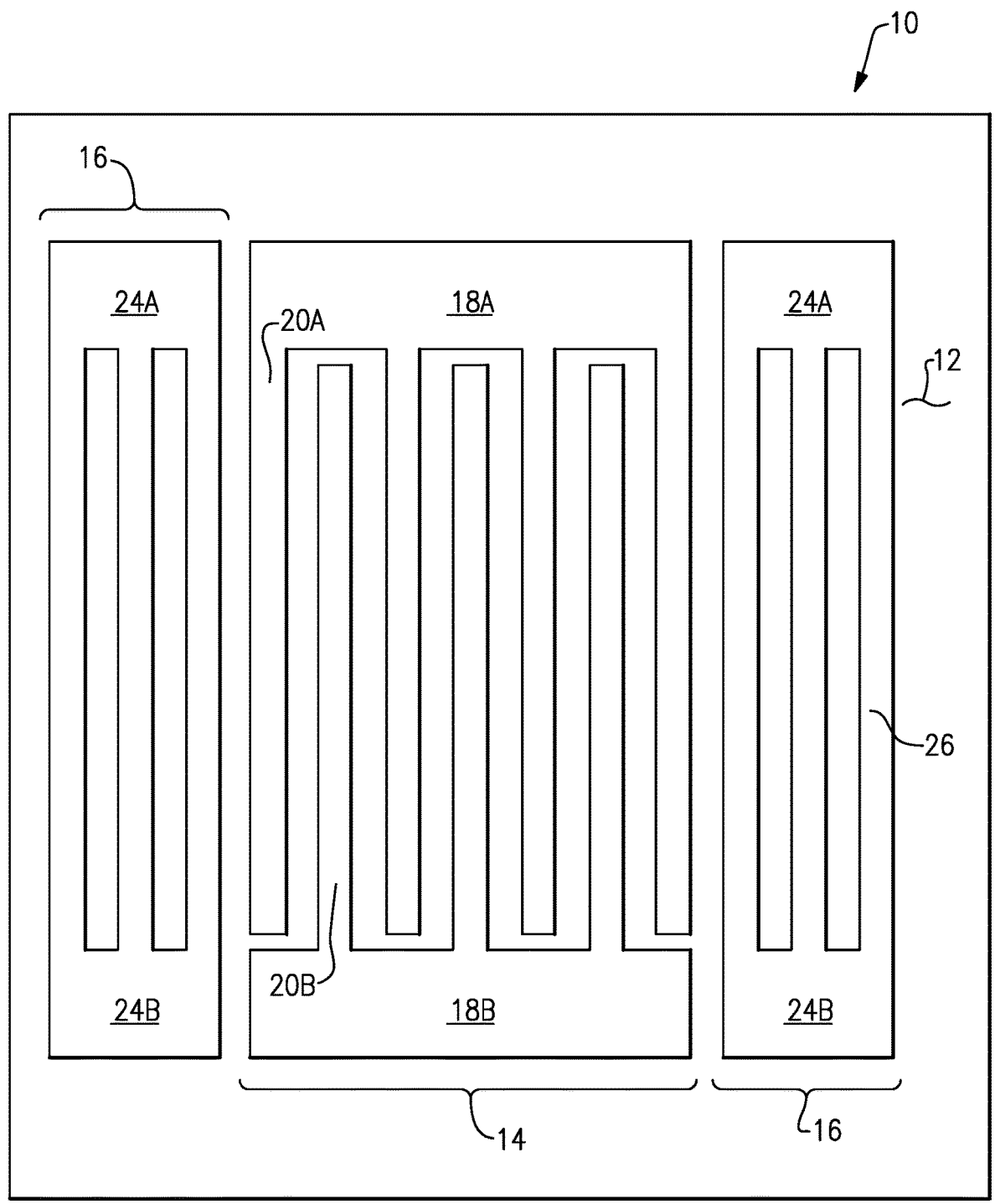
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate ($LiTaO_3$) or lithium niobate ($LiNbO_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
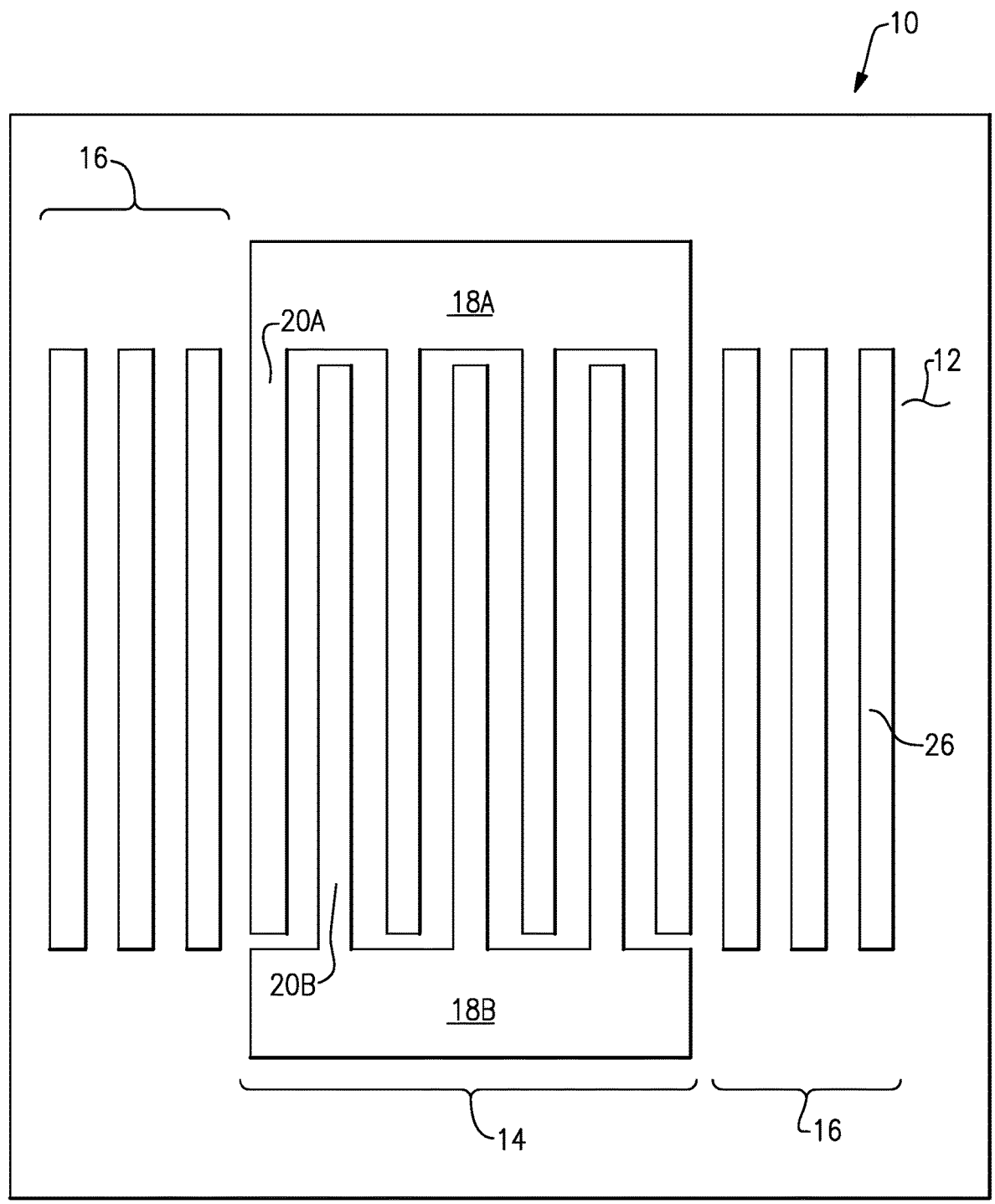
FIG. 1B is a simplified plan view of another example of a surface acoustic wave resonator.
Figure 1C:
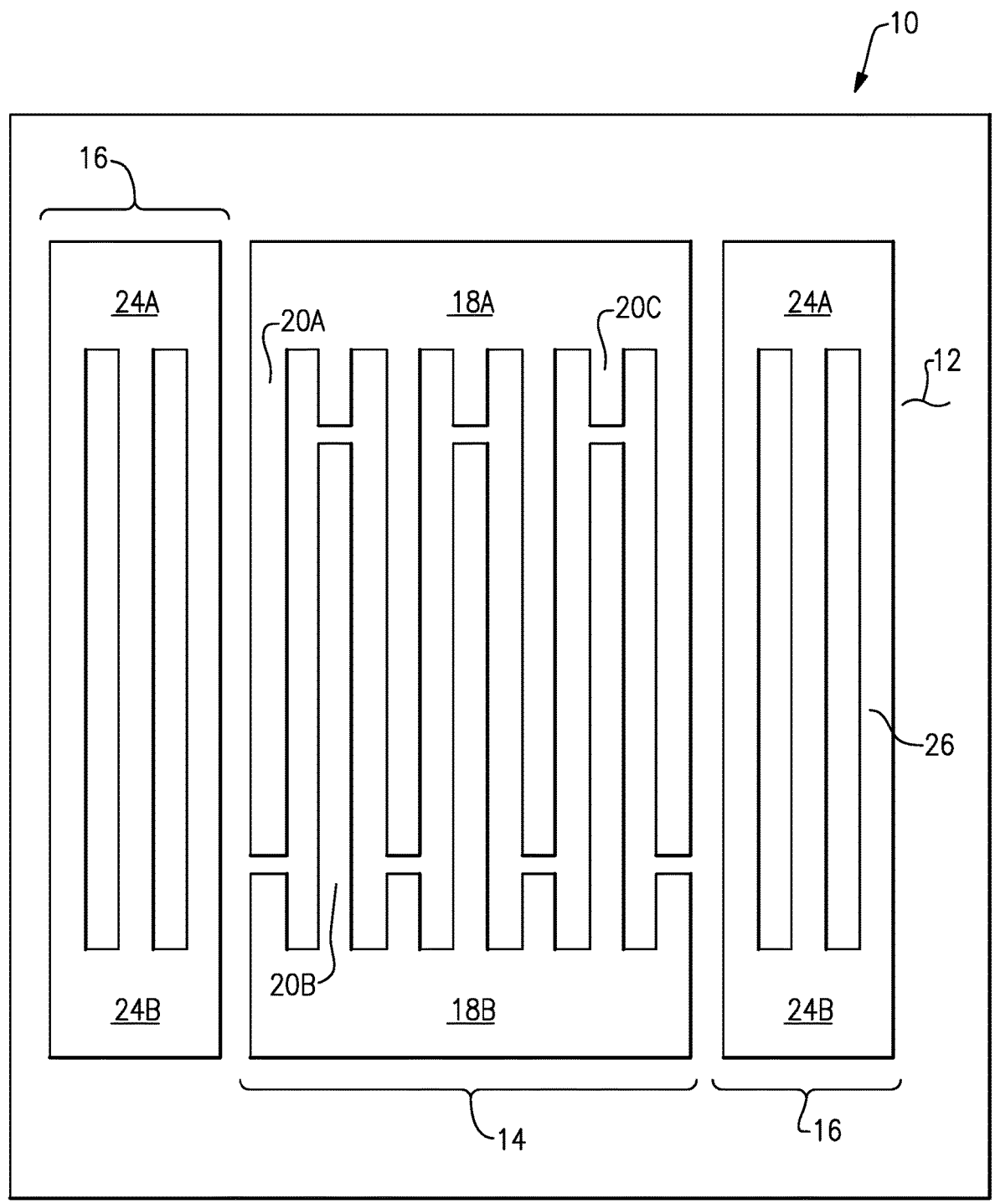
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
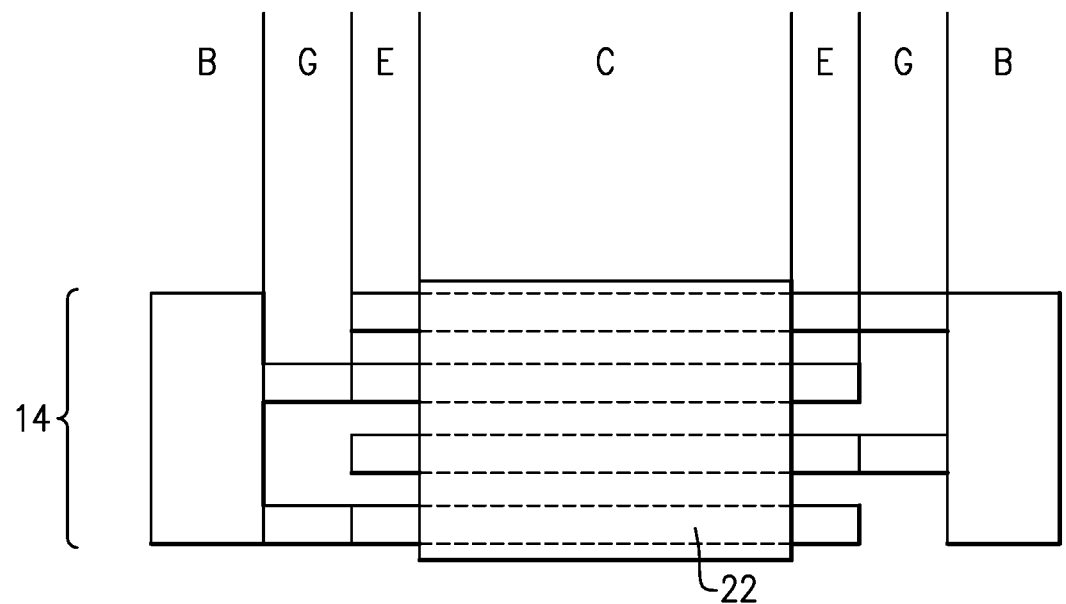
FIG. 2A is a plan view of a portion of electrodes of a surface acoustic wave filter including a structure for suppressing transverse mode spurious signals.
Figure 2B:
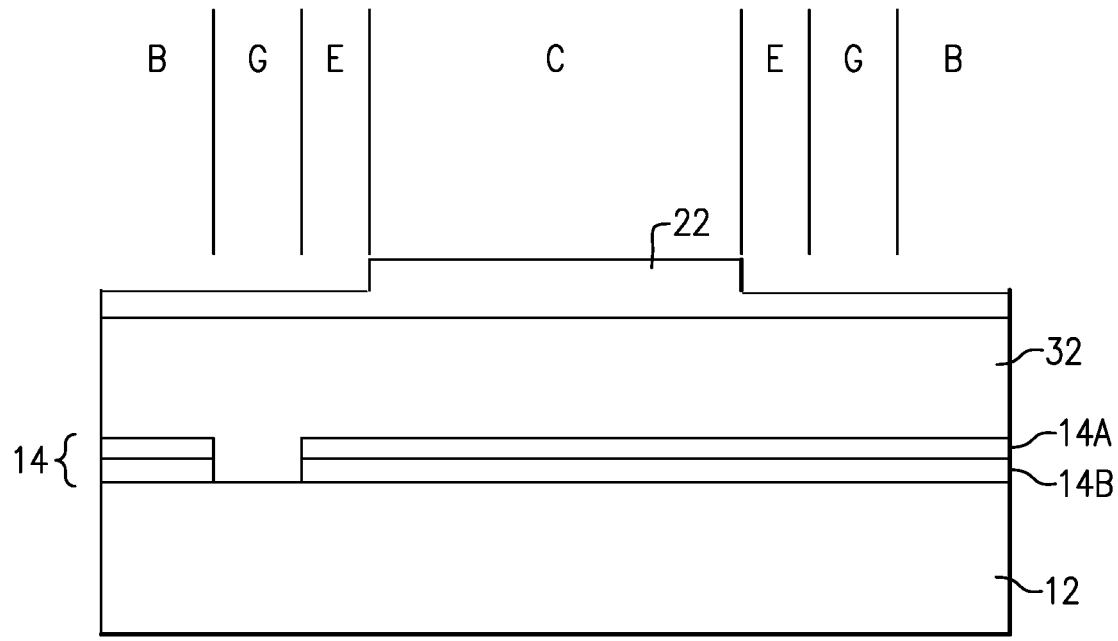
FIG. 2B is a cross-sectional view of a portion of electrodes of a surface acoustic wave resonator including a structure for suppressing transverse mode spurious signals.

As illustrated in FIG. 2A, regions along lengths of the IDT electrodes of a SAW device, e.g., a SAW resonator, may be characterized as busbar regions "B" including the busbar portions of the IDT electrodes, gap regions "G" between the busbar of a first IDT electrode and the ends of the fingers extending from the busbar of a second IDT electrode of the SAW device (and vice-versa), edge regions "E" including end portions of the IDT electrode fingers, and a center region "C" sandwiched between the edge regions. In some embodiments, the gap regions may have widths of between about $1\lambda$ and $1.5\lambda$, the edge regions may have widths of between about $0.5\lambda$ and $1\lambda$, and the center region may have a width of about $20\lambda$, although it should be understood that these dimensions are only examples and may vary based on the design of a particular resonator. In some embodiments, a layer of a dielectric 22 exhibiting a high acoustic wave velocity, for example, silicon nitride ($Si_3N_4$, also abbreviated as "SiN" herein) may be disposed over the IDT electrodes above the center region C. In some embodiments, as illustrated in FIG. 2B, the layer of high acoustic wave velocity material 22 may be deposited over a dielectric material 32 having a lower acoustic wave velocity, for example, silicon dioxide ($SiO_2$) disposed over the entire IDT electrode structure (regions B, G, E, and C). The layer of high acoustic wave velocity material 22 may include a thicker portion disposed above the center region C than above the other regions B, G, and E. The layer of high acoustic wave velocity material 22 disposed above the center region C of the IDT electrodes may help to confine acoustic waves to the center region C and reduce the amount of acoustic energy that travels outside of this region in a direction perpendicular to that of the propagation direction of the main acoustic wave in the device and that may cause transverse mode spurious signals in the frequency response of the SAW device. The main acoustic wave of the device travels perpendicular to the lengthwise direction of the IDT electrodes and the transverse mode spurious signals may be caused by acoustic waves travelling parallel to the lengthwise direction of the IDT electrodes.

The $SiO_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of $SiO_2$ over the IDT electrodes may thus be referred to as a temperature-compensated SAW device, or TCSAW.

As also illustrated in FIG. 2B, the IDT electrodes 14 may be layered electrodes including an upper layer 14A of a highly conductive but low-density material, for example, aluminum (Al), and a lower layer 14B of a less conductive, but more dense material, for example, molybdenum (Mo) or tungsten (W). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity.

Consumers and device manufactures continue to demand electronic products such as cellular telephones with smaller form factors and/or that include additional functionality. Accordingly, there is a continuing demand for smaller and smaller electronic components used in these electronic products, for example, SAW resonators and filters that are incorporated in same. A method of decreasing the size of a SAW resonator while maintaining the operating frequency of the SAW resonator includes increasing the density of the IDT electrodes of the SAW resonator. Higher density IDT electrodes result in a reduced velocity and reduced wavelength of acoustic waves generated in the SAW resonator, which allows denser IDT electrodes to be spaced closer to each other than less dense IDT electrodes to achieve the same operating frequency. In many examples of previously and currently available SAW resonators, the IDT electrodes were formed of Mo, often with a layer of Al on top of the Mo to increase the conductivity of the IDT electrodes. To increase the density of the IDT electrodes, the Mo layer of the IDT electrodes may be replaced with a layer of a higher density material, for example, W.

Figure 3:
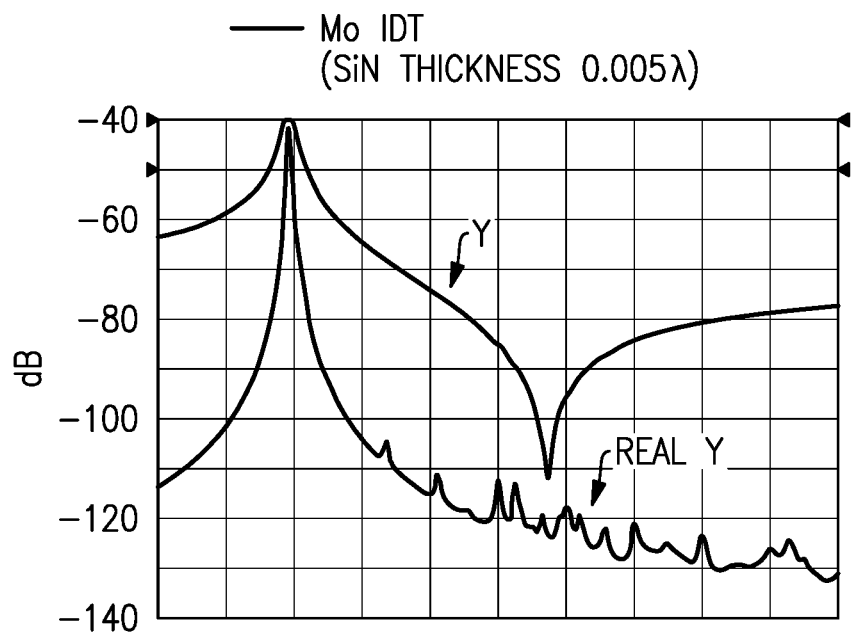
FIG. 3 illustrates transverse spurious mode signals generated in a SAW resonator including IDT electrodes with a molybdenum layer.
Figure 4:
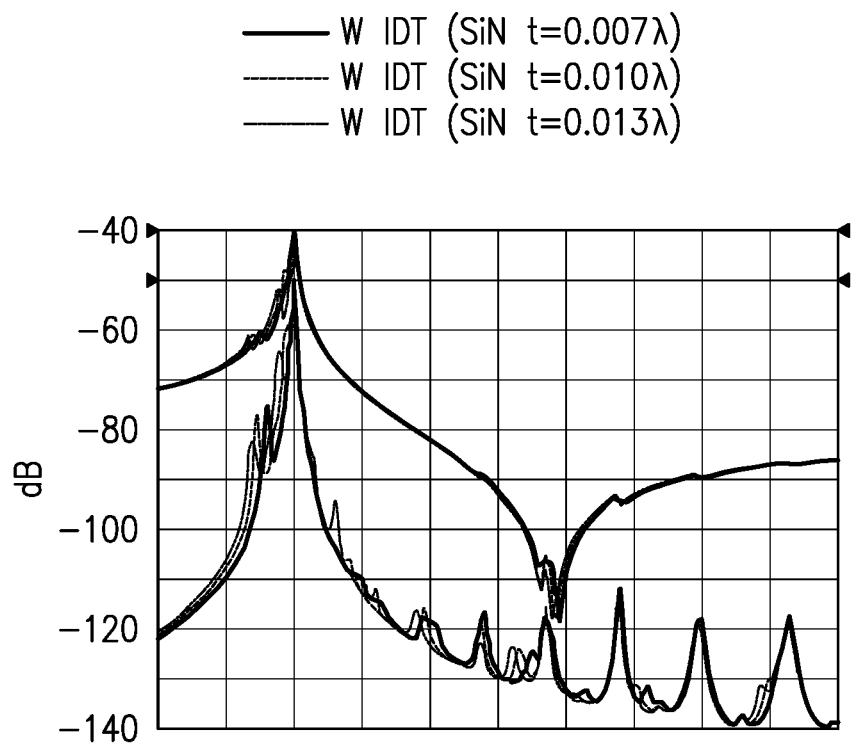
FIG. 4 illustrates transverse spurious mode signals generated in a SAW resonator including IDT electrodes with a tungsten layer.

It has been discovered that when the Mo layer in IDT electrodes of examples of SAW resonators is replaced with W, previously utilized structures, such as the layer of high acoustic wave velocity material 22 disposed over the IDT electrodes above their center region C, may be less effective than desirable in suppressing transverse mode spurious signals that may interfere with operation of the SAW resonator. FIG. 3 illustrates the strength of transverse mode spurious signals generated in a SAW resonator utilizing IDT electrodes with a Mo layer and a silicon nitride layer thickness of $0.005\lambda$, where $\lambda$ represents the wavelength of the main acoustic wave generated in the resonator. As shown, spurious signals at frequencies above the anti-resonance frequency are largely suppressed by the silicon nitride layer. In comparison, FIG. 4 illustrates the strength of transverse mode spurious signals generated in a similar SAW resonator utilizing IDT electrodes with a W layer and various silicon nitride layer thicknesses. It can be seen that even if the thickness of the silicon nitride layer is more than doubled in the SAW resonator utilizing the IDT electrodes with the W layer as compared to that of the SAW resonator utilizing the IDT electrodes with the Mo layer, the transverse mode spurious signals generated in the SAW resonator utilizing the IDT electrodes with the W layer are significantly stronger than the transverse mode spurious signals generated in the SAW resonator utilizing the IDT electrodes with the Mo layer, particularly above the anti-resonance frequency.

Figure 5:
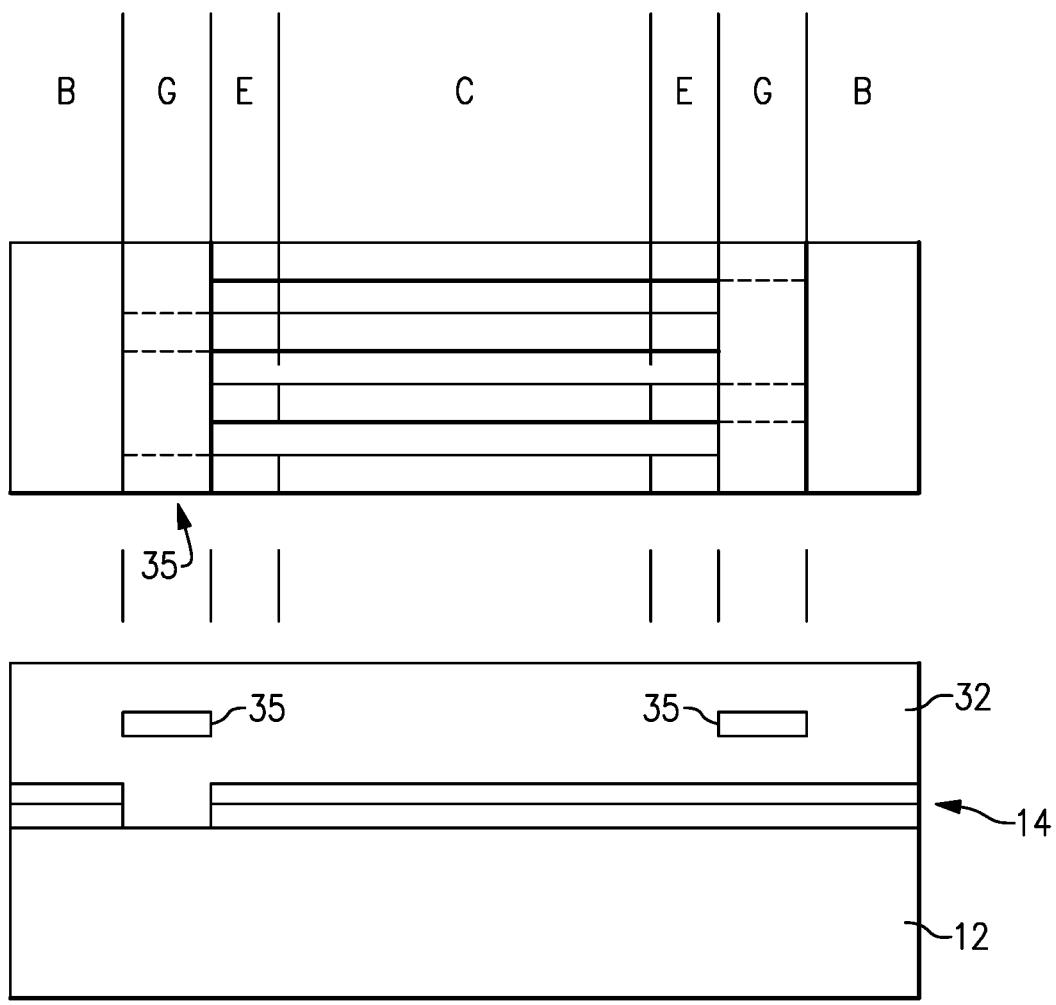
FIG. 5 illustrates an example of a SAW resonator including segments of high-density material disposed in the dielectric layer above the edge regions of the IDT electrodes.

One method of reducing the acoustic velocity in the gap region of a SAW resonator may be to include additional material in the gap regions of the SAW resonator. FIG. 5 illustrates one example of a SAW resonator including segments 35 (also referred to herein as strips) of layers of a material with a higher density than the dielectric material 32 disposed within the layer of dielectric material 32. The segments 35 may be formed of a metal, which may be the same or a different metal from that used in the IDT electrodes. The segments 35 may be formed of, for example, W, Cu, Pt, Au, or any other desirable metal or combination of metals with a density greater than the density of the dielectric material 32. In other embodiments, the segments 35 may be formed of a dielectric material having a greater density than the density of the dielectric material 32, for example, aluminum oxide, calcium oxide, or any other suitable metal oxide, nitride, or combination of metal oxides and/or nitrides or other suitable dielectric material.

Figure 6:
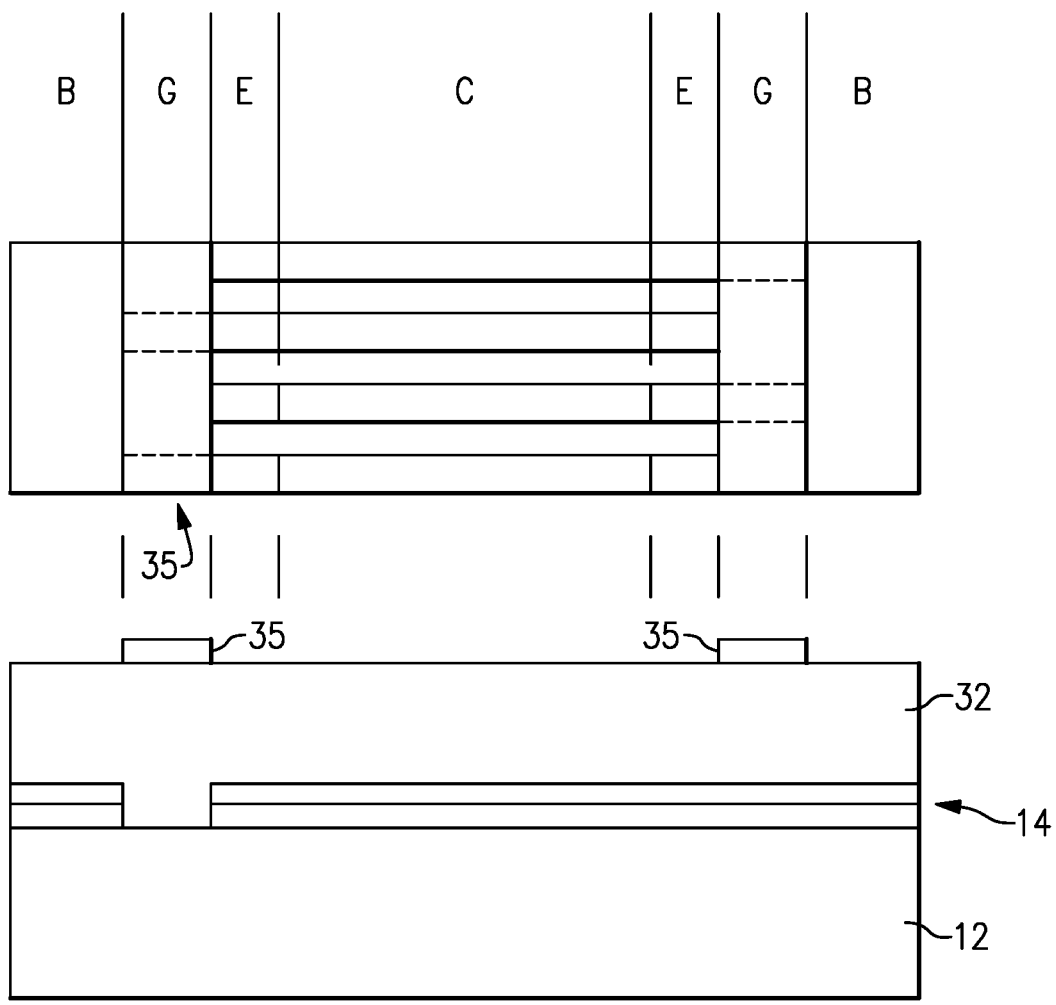
FIG. 6 illustrates an example of a SAW resonator including segments of high-density material disposed on the upper surface of the dielectric layer above the edge regions of the IDT electrodes.

The high-density segments 35 are illustrated in FIG. 5 located centrally in the vertical direction in the layer of dielectric material 32. The height of the location of the high-density segments 35 in the layer of dielectric material 32 is not narrowly critical, although they should be far enough from the IDT electrodes to avoid shorting of the IDT electrodes. In some embodiments, the high-density segments 35 may be located on the upper surface of the layer of dielectric material 32, for example, as illustrated in FIG. 6.

Figure 7:
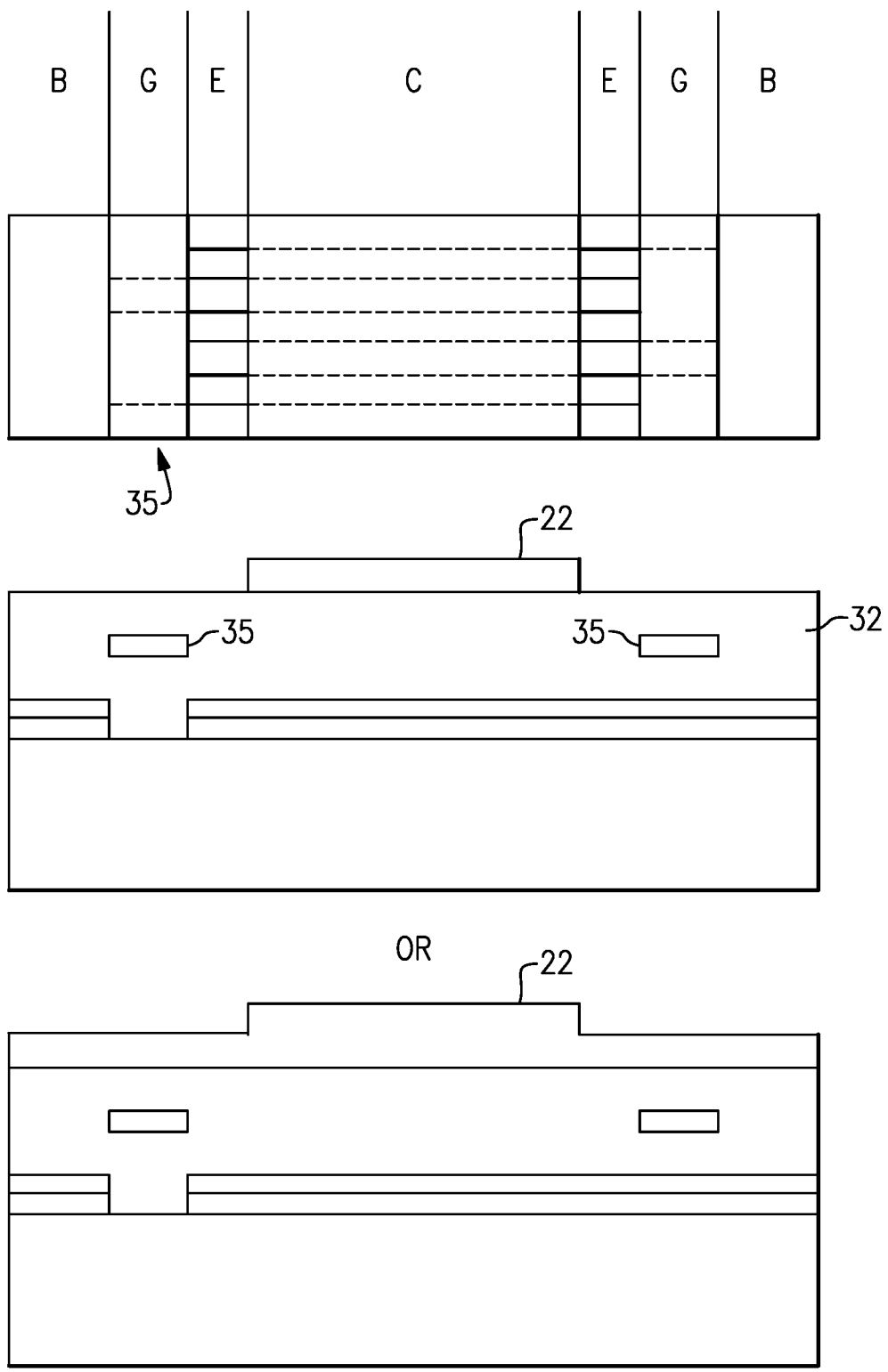
FIG. 7 illustrates an example of a SAW resonator including segments of high-density material disposed in the dielectric layer above the edge regions of the IDT electrodes and a layer of high-velocity dielectric material disposed on top of the dielectric layer disposed on the IDT electrodes and substrate.

As illustrated in FIG. 7, the layer of high acoustic wave velocity material 22 may be disposed on the upper surface of the layer of dielectric material 32 over the center region of the devices including the high-density segments 35 in the layer of dielectric material 32. The layer of dielectric material 22 may be disposed over the center region only, or may include a thicker portion disposed over the center region and thinner portions disposed over the edge, gap and busbar regions.

The thickness of the high-density segments 35 may be selected based on desired performance characteristics of a SAW resonator, and in some embodiments may have thicknesses ranging from, for example, about $0.01\lambda$ to about $0.02\lambda$.

Figure 8:
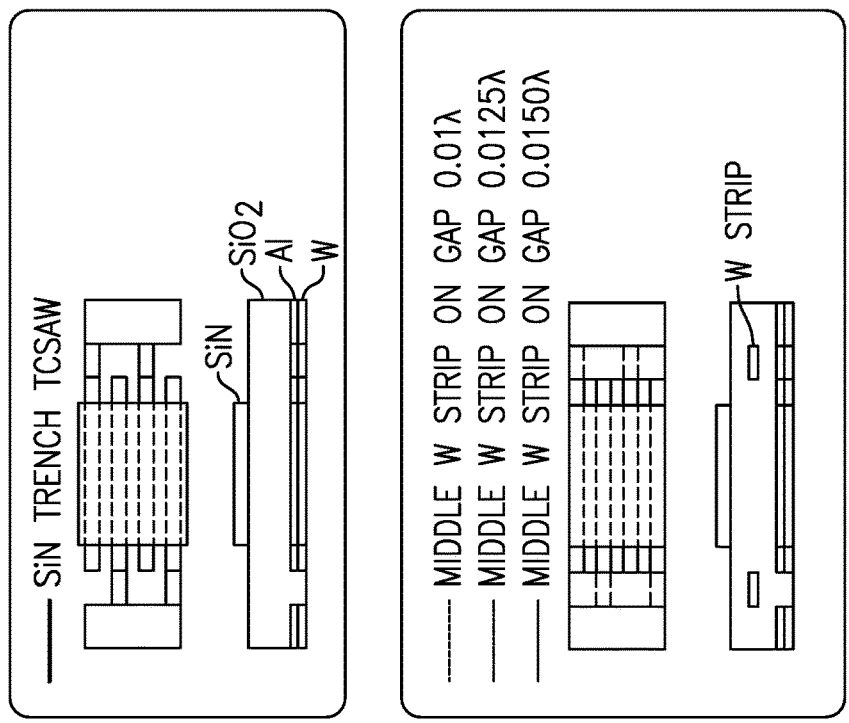
FIG. 8 illustrates a difference in spurious signals in the admittance curve of a SAW resonator including segments of high-density material disposed in the dielectric layer above the edge regions of the IDT electrodes and a SAW resonator not including the segments of high-density material.
Figure 8:
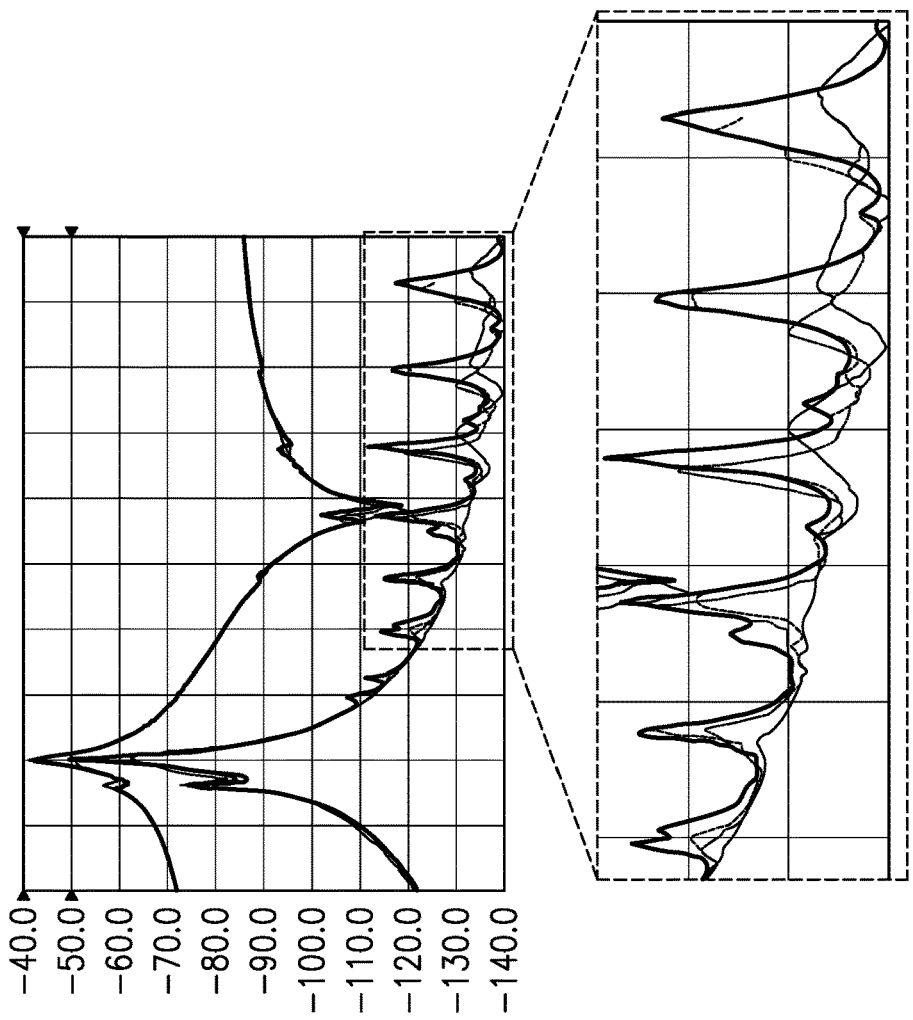

Results of a simulation showing a comparison between the intensity of spurious signals in the admittance curve of a SAW resonator including W/Al IDT electrodes and a layer of high acoustic wave velocity material 22 disposed on the layer of dielectric material 32 covering the IDT electrodes, with and without the inclusion of W film segments 35 in the layer of dielectric material 32 is illustrated in FIG. 8. As can be seen, the inclusion of $0.010\lambda$ thick W strips above the gap regions of the IDT electrodes of the SAW device moderately decreases the intensity of the spurious signals in the admittance curve of the SAW resonator as compared to the SAW resonator without the W strips. As the thickness of the W strips disposed above the gap regions of the IDT electrodes is increased to $0.0125\lambda$, and then again to $0.0150\lambda$, the intensity of the spurious signals in the admittance curve of the SAW resonator decreases even further.

Figure 9:
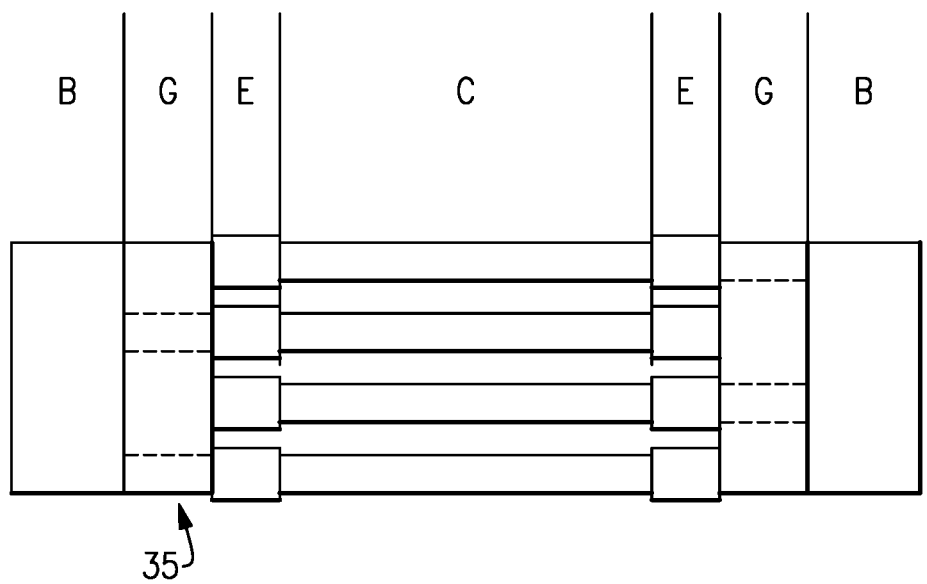
FIG. 9 illustrates an example of a SAW resonator segments of high-density material disposed in the dielectric layer above the edge regions of the IDT electrodes and IDT electrodes that are thickened in the edge regions as compared to the center region.
Figure 9:
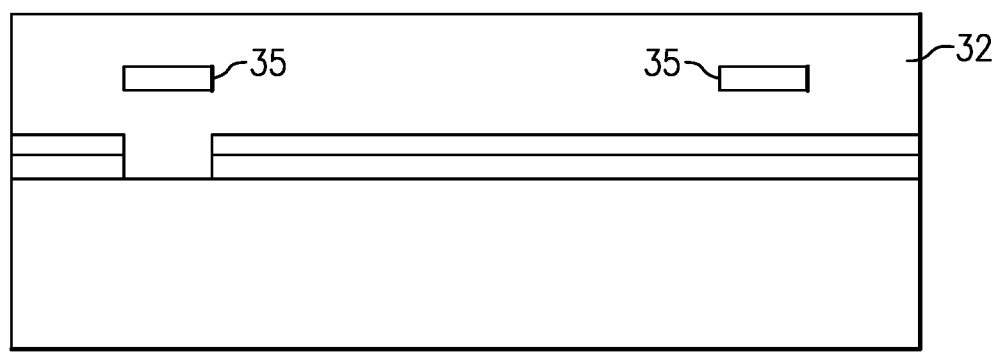

In some embodiments, in addition to providing a SAW resonator with the high-density segments 35 in the layer of dielectric material 32, the portions of the IDT electrodes 20A, 20B in the edge regions E of the resonator may be increased in width relative to the width of the IDT electrodes in the center C and gap G regions. This will have the effect of lowering the acoustic velocity in the edge regions due to the additional mass of the IDT electrodes in the edge regions. Increasing the width of the IDT electrodes in the edge regions of the SAW resonator may bring the acoustic velocity in the edge regions E of the resonator closer to the acoustic velocity in the center region C of the resonator, which may further suppress transverse mode spurious signals in the resonator. In some embodiments, the thickness of the IDT electrodes in the edge regions may be increased relative to the thickness of the IDT electrodes in the center regions to a degree that causes the acoustic velocity in the edge regions to be between about 1% or 1.5% less, or at least 1% or 1.5% less than the acoustic velocity in the center region. An example of a portion of a SAW resonator having IDT electrodes of the resonator that are wider in the edge regions E than in the center region C of the resonator is illustrated in FIG. 9. In some embodiments the shape and size of the enlarged IDT electrodes in the edge regions and the inclusion of the high-density segments 35 in the layer of dielectric material 32 may be sufficient to cause the SAW resonator to exhibit an acoustic velocity in the gap regions that is greater than an acoustic velocity in the center region that is, in turn, greater than an acoustic velocity in the edge regions.

Figure 10:
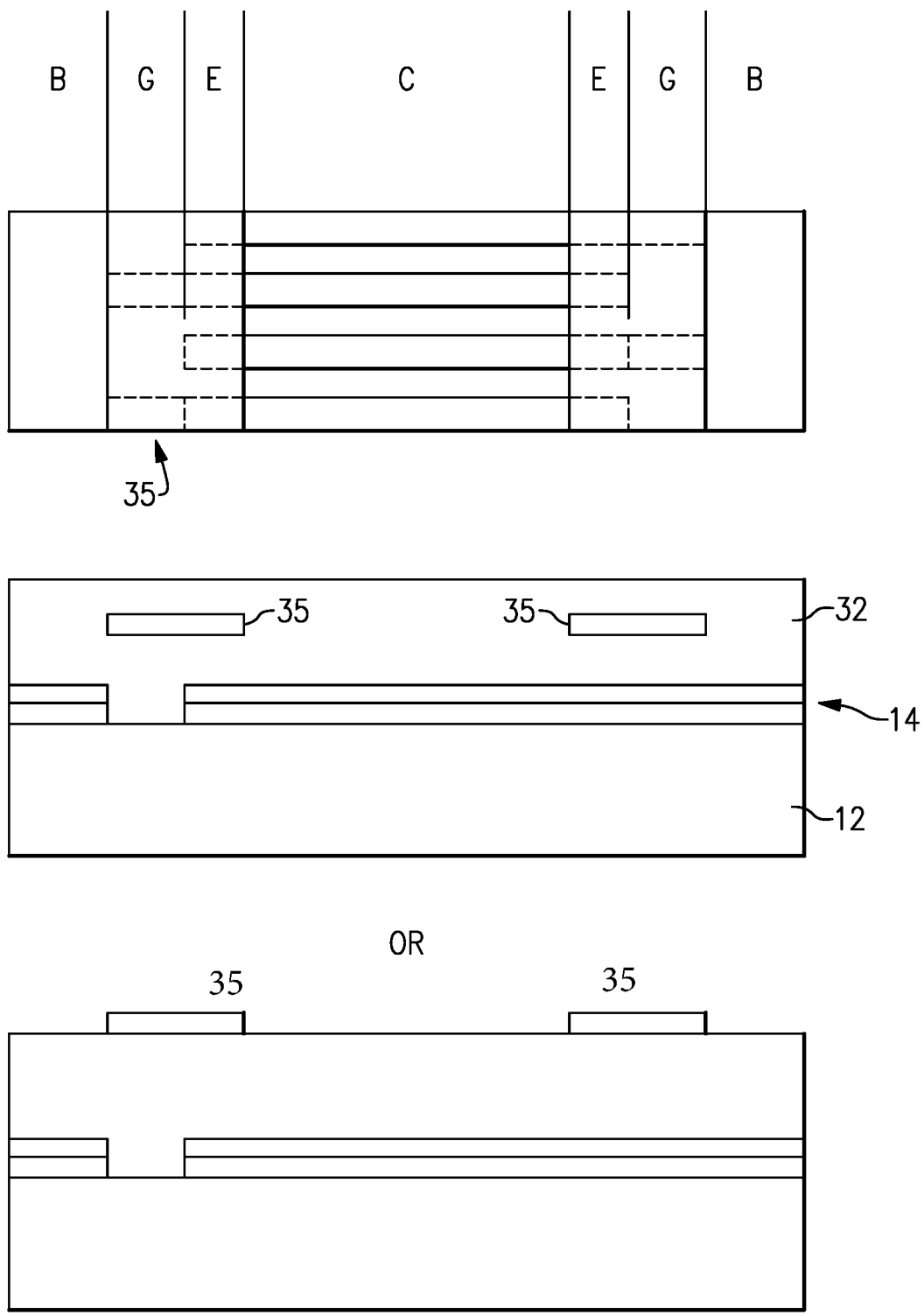
FIG. 10 illustrates examples of SAW resonators including contiguous segments of high-density material disposed in the dielectric layer above the edge regions and gap regions of the IDT electrodes.
Figure 11:
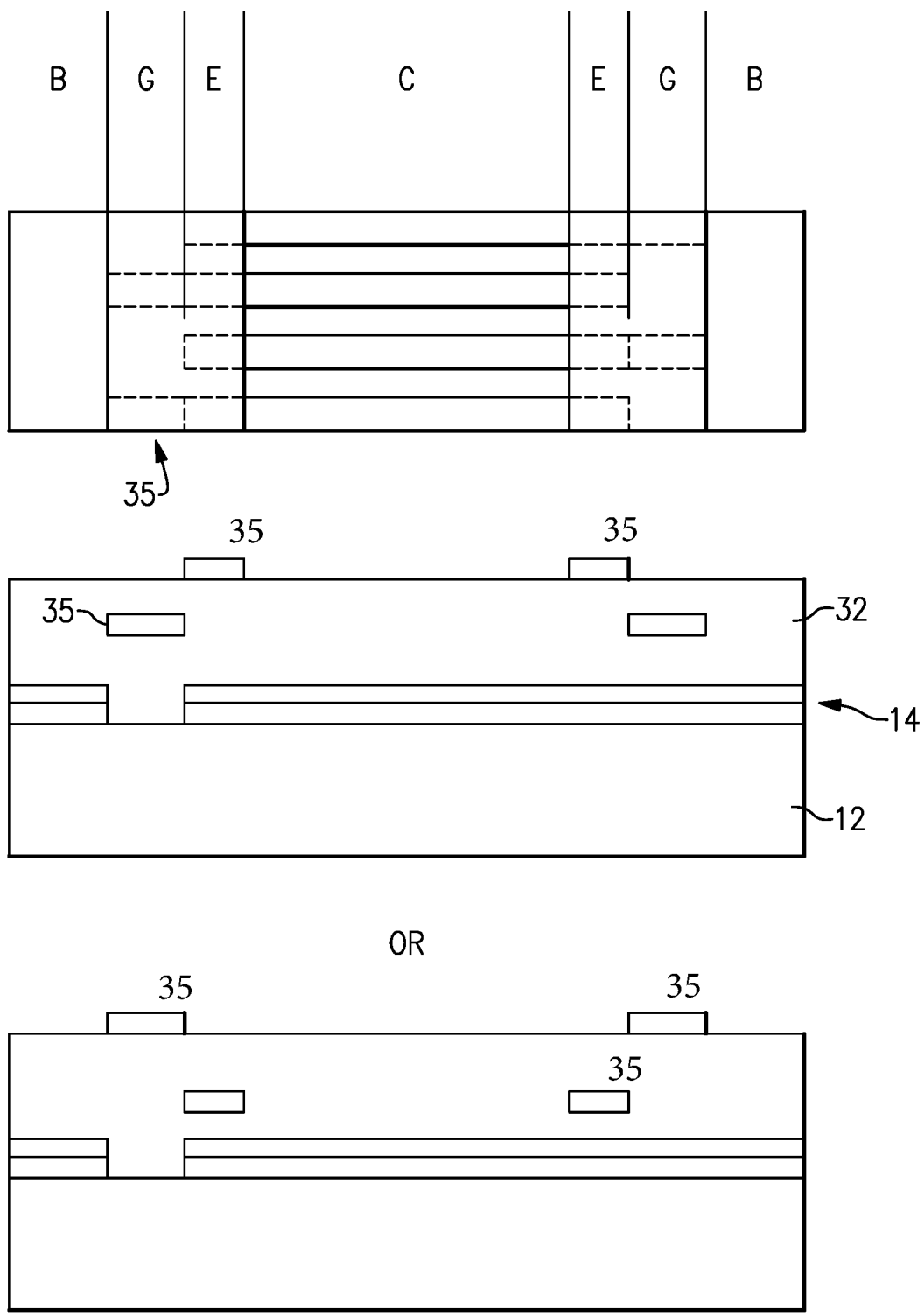
FIG. 11 illustrates examples of SAW resonators including discontinuous segments of high-density material disposed within and on top of the dielectric layer above the edge regions and gap regions of the IDT electrodes.
Figure 12:
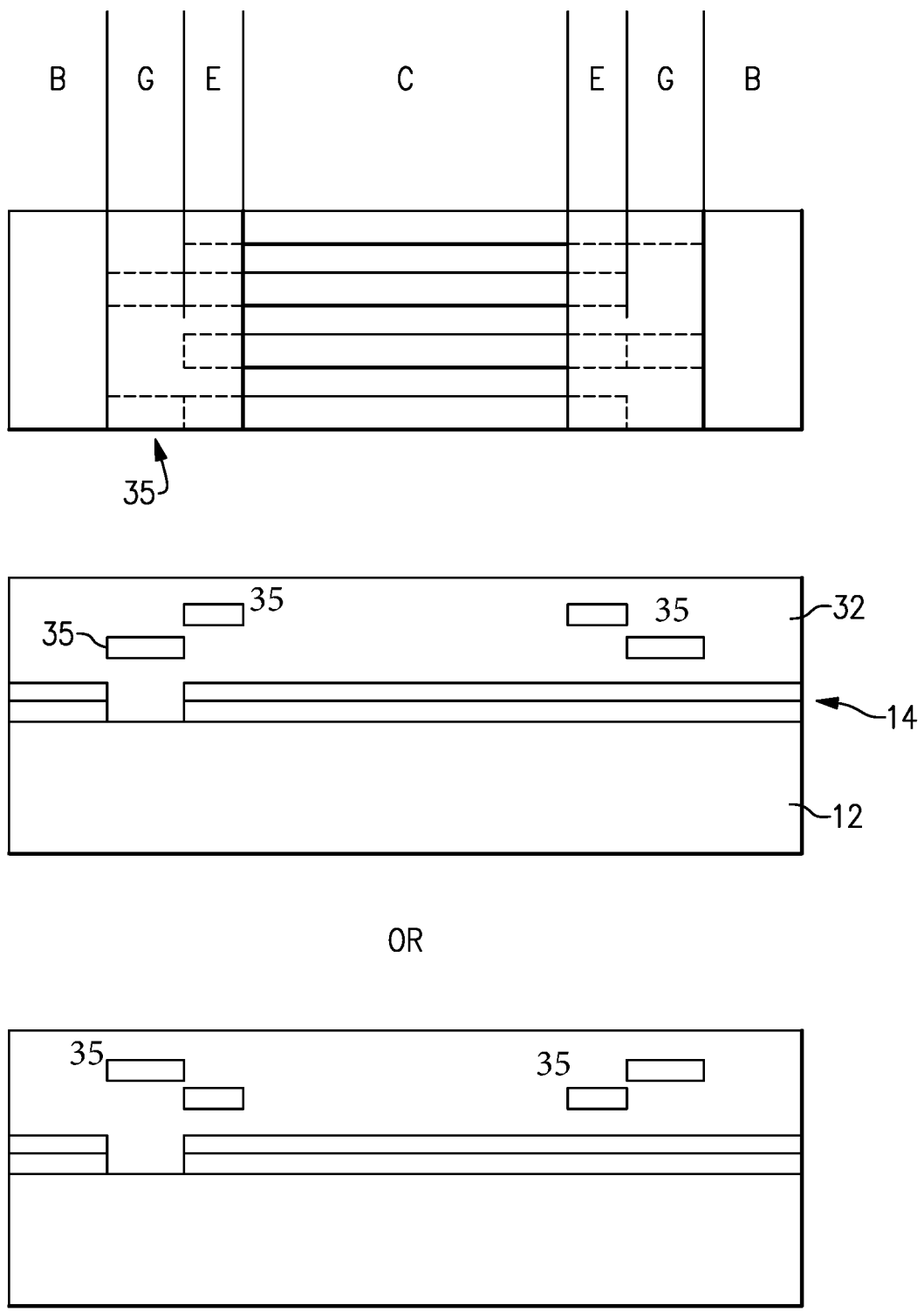
FIG. 12 illustrates examples of SAW resonators including discontinuous segments of high-density material disposed in the dielectric layer above the edge regions and gap regions of the IDT electrodes.
Figure 13:
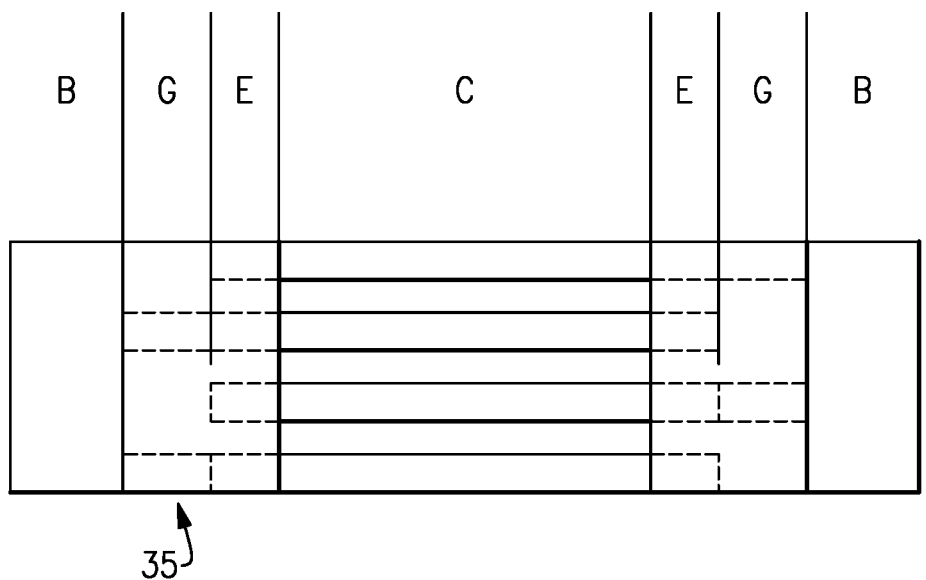
FIG. 13 illustrates examples of SAW resonators including segments of high-density material with different thicknesses disposed in the dielectric layer above the edge regions and gap regions of the IDT electrodes.
Figure 13:
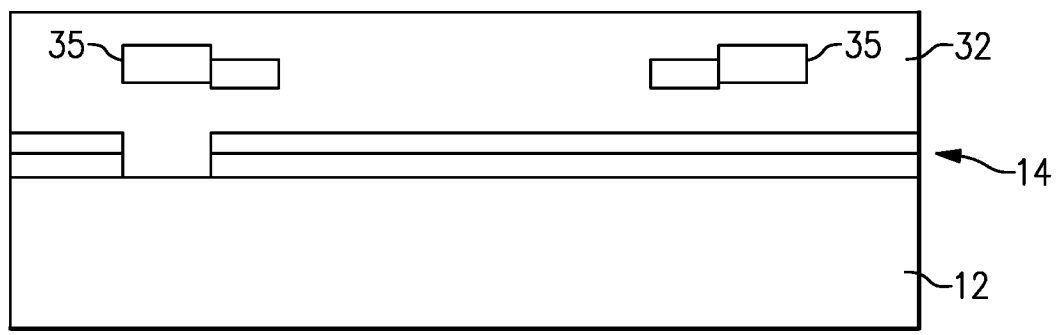
Figure 13:
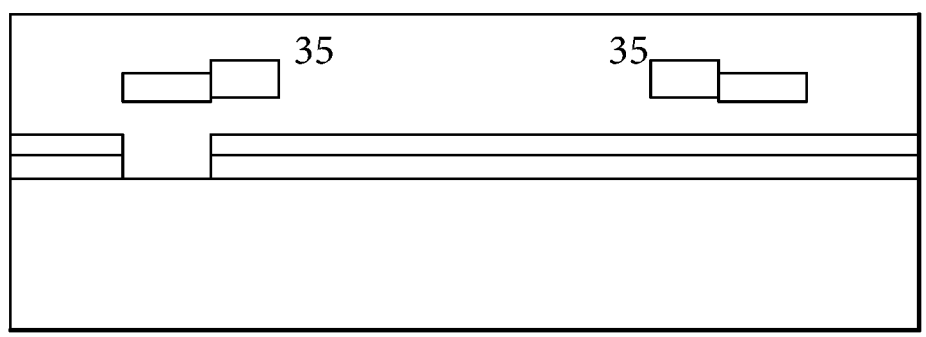

In addition to including segments or strips 35 of high-density material over the gap regions, segments or strips 35 of high-density material may also be disposed partially or entirely over the edge regions of the IDT electrodes in a SAW resonator. As illustrated in FIG. 10, the segments or strips 35 of high-density material may be in the form of contiguous segments or strips 35 extending through both the gap and edge regions. As also illustrated in FIG. 10, the segments or strips 35 of high-density material may be disposed either within the layer of dielectric material 32 or on the upper surface of the layer of dielectric material 32. In other embodiments, for example, as illustrated in FIG. 11, the portions of the strips 35 of high-density material over the gap regions may be disposed within the layer of dielectric material 32 while the portions of the strips 35 of high-density material over the edge regions may be disposed on the upper surface of the layer of dielectric material 32, or, the portions of the strips 35 of high-density material over the edge regions may be disposed within the layer of dielectric material 32 while the portions of the strips 35 of high-density material over the gap regions may be disposed on the upper surface of the layer of dielectric material 32. Alternatively, the portions of the strips 35 of high-density material over the both the edge regions and the gap regions may be disposed within the layer of dielectric material 32 but at different heights, for example, as illustrated in FIG. 12. Further, the strips 35 of high-density material over the gap regions may have different vertical thicknesses than the strips 35 of high-density material over the edge regions. The strips 35 of high-density material over the gap regions may be either thicker or thinner than the strips 35 of high-density material over the edge regions, as illustrated in FIG. 13.

Figure 14:
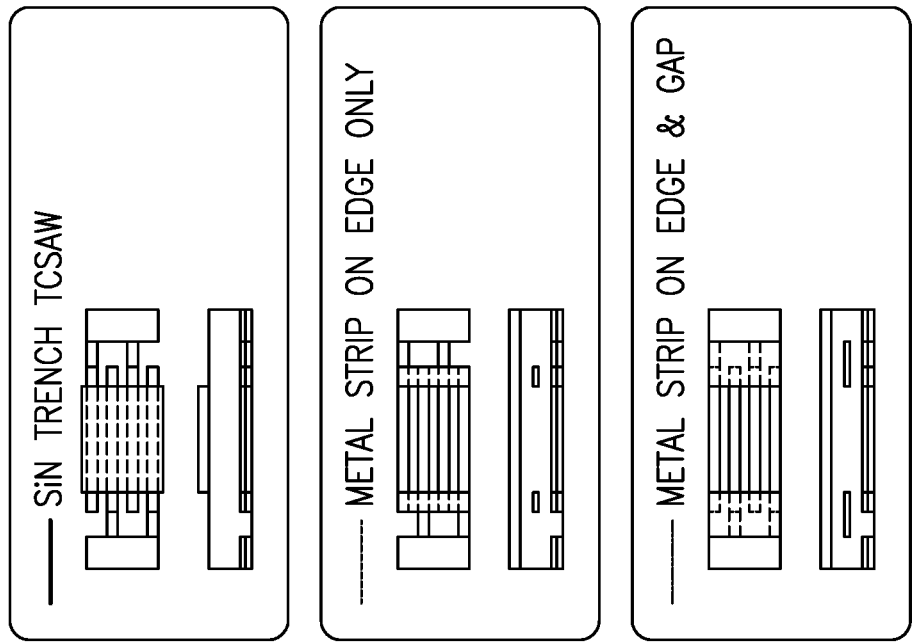
FIG. 14 illustrates a difference in spurious signals in the admittance curve of a SAW resonator including segments of high-density material disposed in the dielectric layer above the edge regions of the IDT electrodes, segments of high-density material disposed in the dielectric layer above the edge and gap regions of the IDT electrodes, and a SAW resonator not including the segments of high-density material.
Figure 14:
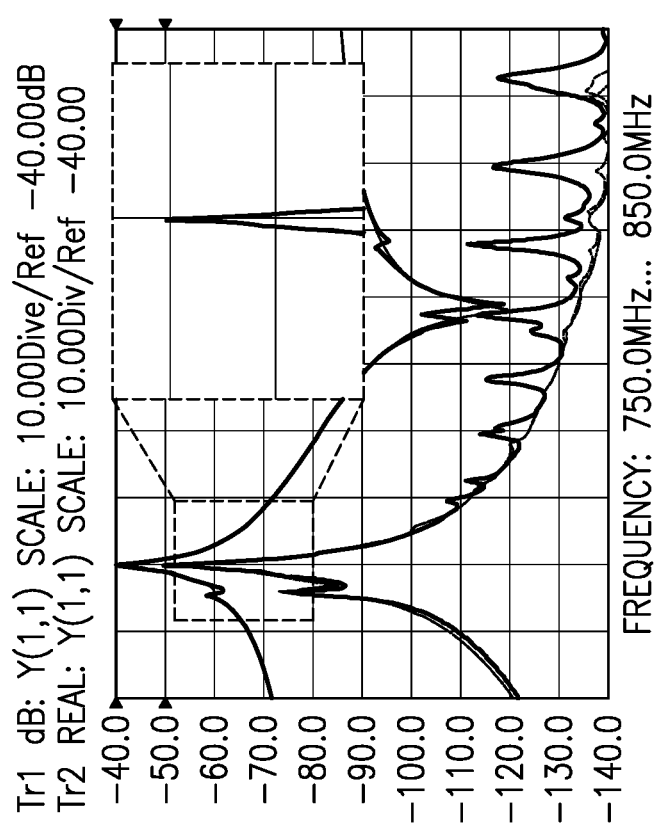

FIG. 14 illustrates results of a simulation comparing the intensity of spurious signals in the admittance curve of a SAW resonator including W/Al IDT electrodes and a layer of high acoustic wave velocity material 22 disposed on the layer of dielectric material 32 covering the IDT electrodes, without the inclusion of W film segments 35 in the layer of dielectric material 32, with the inclusion of W film segments 35 in the layer of dielectric material 32 in the edge regions only, and with the inclusion of W film segments 35 in the edge and gap regions of the layer of dielectric material 32. As illustrated, inclusion of the W film segments 35 in the layer of dielectric material 32 in the edge regions significantly reduces the intensity of the spurious signals as compared to the SAW resonator without W film segments 35 in the layer of dielectric material 32. Inclusion of the W film segments in both the edge and gap regions of the IDT electrodes reduces the intensity of the spurious signals even further than including the W film segments in the edge regions of the IDT electrodes alone.

Figure 15:
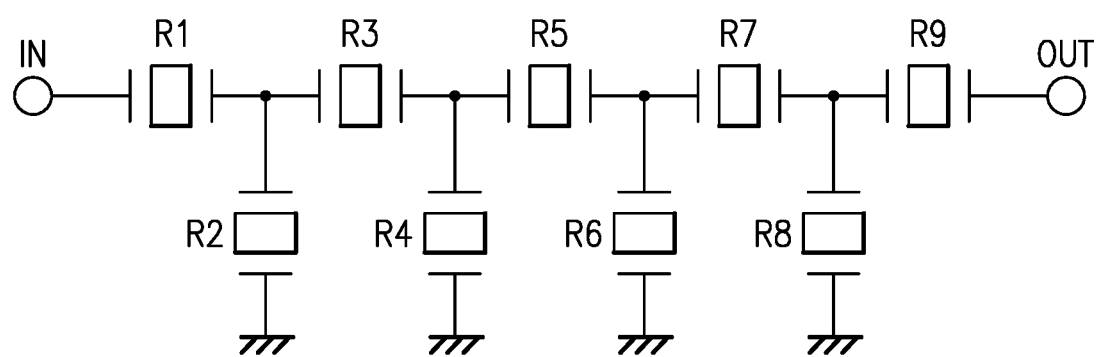
FIG. 15 is a schematic diagram of a radio frequency ladder filter.

In some embodiments, multiple SAW resonators as disclosed herein may be combined into a filter, for example, an RF ladder filter schematically illustrated in FIG. 15 and including a plurality of series resonators R1, R3, R5, R7, and R9, and a plurality of parallel resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 16:
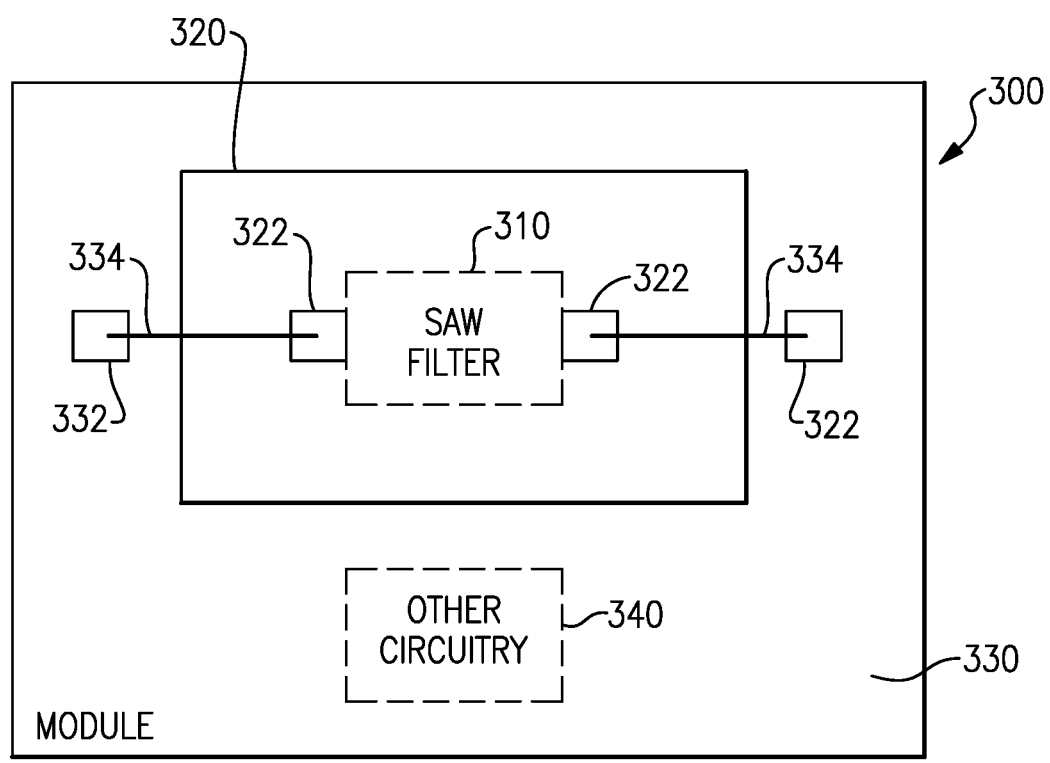
FIG. 16 is a block diagram of one example of a filter module that can include one or more surface acoustic wave resonators according to aspects of the present disclosure.
Figure 17:
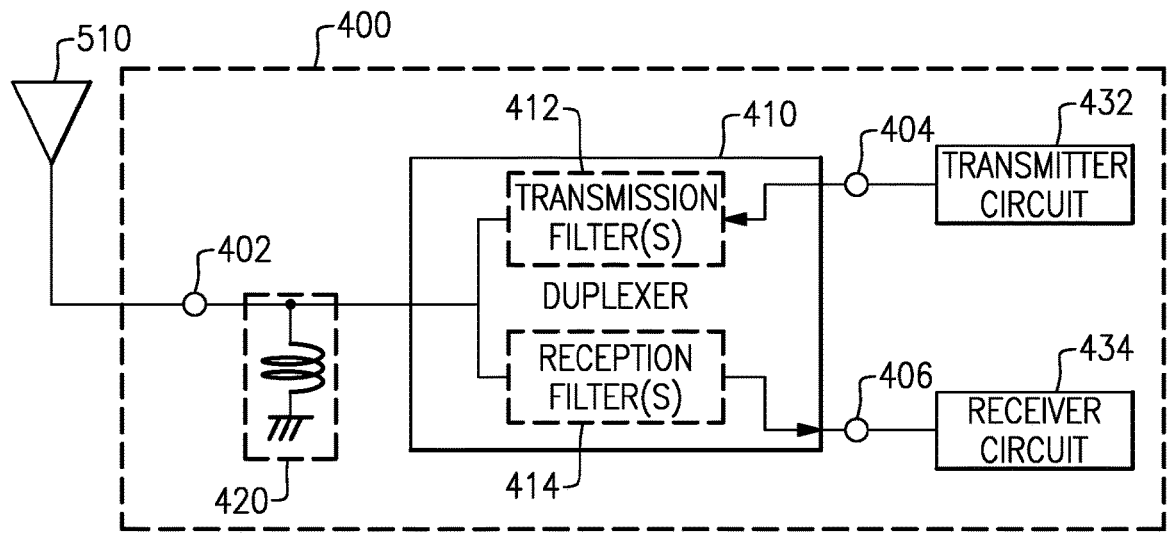
FIG. 17 is a block diagram of one example of a front-end module that can include one or more filter modules according to aspects of the present disclosure.
Figure 18:
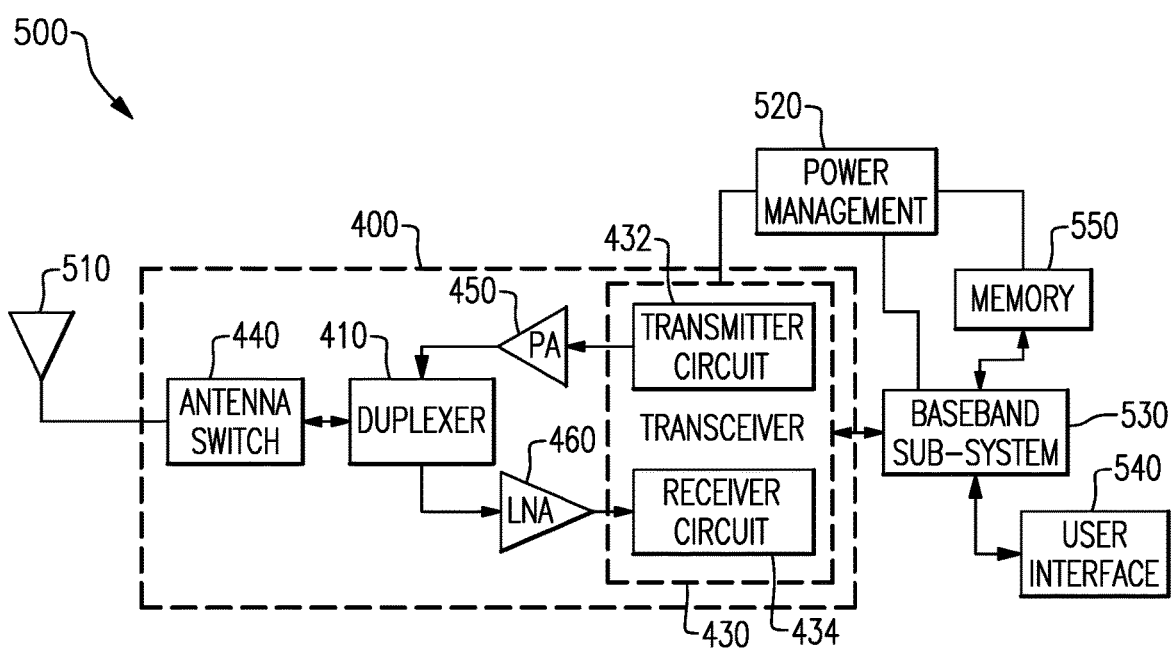
FIG. 18 is a block diagram of one example of a wireless device including the front-end module of FIG. 17.

The acoustic wave resonators discussed herein can be implemented in a variety of packaged modules. Some example packaged modules will now be discussed in which any suitable principles and advantages of the packaged acoustic wave resonators discussed herein can be implemented. FIGS. 16, 17, and 18 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 16 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 17, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 17, however in other embodiments these components may be integrated into a common transceiver circuit or module. As will be appreciated by those skilled in the art, the front-end module 400 may include other components that are not illustrated in FIG. 17 including, but not limited to, switches, electromagnetic couplers, amplifiers, processors, and the like.

FIG. 18 is a block diagram of one example of a wireless device 500 including the antenna duplexer 410 shown in FIG. 17. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 17. The front-end module 400 includes the duplexer 410, as discussed above. In the example shown in FIG. 18 the front-end module 400 further includes an antenna switch 440, which can be configured to switch between different frequency bands or modes, such as transmit and receive modes, for example. In the example illustrated in FIG. 18, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 17.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 18, the front-end module 400 may further include a low noise amplifier module 460, which amplifies received signals from the antenna 510 and provides the amplified signals to the receiver circuit 434 of the transceiver 430.

The wireless device 500 of FIG. 18 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
   a substrate including a piezoelectric material;
   interdigital transducer (IDT) electrodes disposed on a surface of the substrate, the IDT electrodes having gap regions, edge regions, and center regions;
   a first dielectric film having a lower surface disposed on the IDT electrodes and the surface of the substrate; and
   a material having a density greater than a density of the first dielectric film disposed above only the gap regions of the IDT electrodes within the first dielectric film, a lower portion of the first dielectric film being disposed below the material between the material and the substrate, an upper portion of the first dielectric film being disposed above the material.

2. The acoustic wave device of claim 1 wherein a velocity of an acoustic wave in the gap regions is greater than the velocity of the acoustic wave in the center regions, and the velocity of the acoustic wave in the center regions is greater than the velocity of the acoustic wave in the edge regions.

3. The acoustic wave device of claim 1 wherein the material is a same metal as a metal included in the IDT electrodes.

4. The acoustic wave device of claim 1 wherein the material is a different metal from a metal or metals included in the IDT electrodes.

5. The acoustic wave device of claim 1 wherein the material is a dielectric material.

6. The acoustic wave device of claim 1 wherein widths of the IDT electrodes in the edge regions are greater than widths of the IDT electrodes in the center regions, the width direction being parallel to a propagation direction of a main acoustic wave through the acoustic wave device.

7. The acoustic wave device of claim 1 further comprising a second dielectric film having an acoustic velocity greater than an acoustic velocity of the first dielectric film disposed on an upper surface of the first dielectric film.

8. The acoustic wave device of claim 7 wherein the second dielectric film has a thickness above the center region that is greater than a thickness of the second dielectric film above the edge regions and in the gap regions.

9. A radio frequency filter comprising:
at least one acoustic wave device, the at least one acoustic wave device including
a substrate including a piezoelectric material,
interdigital transducer (IDT) electrodes disposed on a surface of the substrate, the IDT electrodes having gap regions, edge regions, and center regions,
a first dielectric film having a lower surface disposed on the IDT electrodes and the surface of the substrate, and
a material having a density greater than a density of the first dielectric film disposed above only the gap regions of the IDT electrodes within the first dielectric film, a lower portion of the first dielectric film being disposed below the material between the material and the substrate, an upper portion of the first dielectric film being disposed above the material.

10. An electronics module comprising:
at least one radio frequency filter including at least one acoustic wave device, the at least one acoustic wave device including
a substrate including a piezoelectric material,
interdigital transducer (IDT) electrodes disposed on a surface of the substrate, the IDT electrodes having gap regions, edge regions, and center regions,
a first dielectric film having a lower surface disposed on the IDT electrodes and the surface of the substrate, and
a material having a density greater than a density of the first dielectric film disposed above only the gap regions of the IDT electrodes within the first dielectric film, a lower portion of the first dielectric film being disposed below the material between the material and the substrate, an upper portion of the first dielectric film being disposed above the material.

* * * * *